United States Patent
Chung

(10) Patent No.: US 8,497,173 B2
(45) Date of Patent: Jul. 30, 2013

(54) SEMICONDUCTOR DEVICE AND METHOD FOR MANUFACTURING THE SAME

(75) Inventor: Woo Young Chung, Yongin (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/230,776

(22) Filed: Sep. 12, 2011

(65) Prior Publication Data

US 2012/0061750 A1 Mar. 15, 2012

(30) Foreign Application Priority Data

Sep. 13, 2010 (KR) .......................... 10-2010-0089441

(51) Int. Cl.
*H01L 21/336* (2006.01)
(52) U.S. Cl.
USPC ........... 438/270; 438/259; 438/286; 257/396; 257/397; 257/E21.655
(58) Field of Classification Search
USPC .................. 257/E21.655, 396–397; 438/259, 438/270, 286
See application file for complete search history.

(56) References Cited

U.S. PATENT DOCUMENTS

| | | | | |
|---|---|---|---|---|
| 7,164,170 B2 * | 1/2007 | Kim | ............................... | 257/330 |
| 7,674,677 B2 * | 3/2010 | Chun | ............................ | 438/259 |
| 8,268,690 B2 * | 9/2012 | Lee et al. | ....................... | 438/286 |
| 2005/0087776 A1 * | 4/2005 | Kim | ............................... | 257/262 |
| 2007/0059871 A1 | 3/2007 | Yamazaki | | |
| 2008/0290404 A1 * | 11/2008 | Chun | ............................ | 257/330 |
| 2010/0213540 A1 * | 8/2010 | Chun | ............................ | 257/330 |
| 2011/0312139 A1 * | 12/2011 | Chun | ............................ | 438/270 |

FOREIGN PATENT DOCUMENTS

| | | |
|---|---|---|
| JP | 04-112579 A | 4/1992 |
| JP | 05-183155 A | 7/1993 |
| JP | 2000-269484 A | 9/2000 |

\* cited by examiner

*Primary Examiner* — Cheung Lee
*Assistant Examiner* — Jeremy Joy

(57) ABSTRACT

A semiconductor device and a method for manufacturing the same are disclosed. A recess gate structure is formed between an overlapping region between a gate and a source/drain so as to suppress increase in gate induced drain leakage (GIDL), and a gate insulation film is more thickly deposited in a region having weak GIDL, thereby reducing GIDL and thus improving refresh characteristics due to leakage current.

9 Claims, 8 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0089441 filed on Sep. 13, 2010, the disclosure of which is hereby incorporated in its entirety by reference, is claimed.

BACKGROUND OF THE INVENTION

Embodiments of the present invention relate to a semiconductor device and a method for manufacturing the same.

In general, semiconductor memories, which store information such as data or commands of programs, include a DRAM and a SRAM. A DRAM is a memory in which stored data may be read and other information may be stored. The DRAM allows information to be read therefrom and written thereon, but information stored in the DRAM is lost unless the information is periodically rewritten within a designated period while power is supplied. Although a DRAM needs to be refreshed in this way, it has a low price per memory cell and a high integration density, and is thus widely used as a high capacity memory.

A metal-oxide semiconductor field effect transistor (hereinafter, referred to as a "MOSFET") is mainly used in memories, such as a DRAM, or logics. A MOSFET has a structure in which, after a gate oxide film, a polysilicon film, a gate metal, and a gate hard mask layer are deposited on a semiconductor substrate, gates are stacked thereon by a mask/etching process to form channels.

If the size of a semiconductor device having a general structure is reduced, channel length is also shortened. When the channel length of the device is shortened, a short channel effect and gate induced drain leakage (GIDL) can occur. In order to prevent such deterioration, it is necessary to increase gate channel length. However, increasing gate channel length causes problems, such as increasing gate resistance and deterioration of GIDL at a region where a gate and a source/drain region overlap with each other.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device and a method for manufacturing the same, in which a recess gate structure is formed in a region where a gate and a source/drain overlap so as to suppress an increase in gate induced drain leakage (GIDL), and a gate insulation film is more thickly deposited in a region having weak GIDL, resulting in reduction of GIDL, thus improving refresh characteristics due to leakage current.

In accordance with an aspect of the present invention, a method for manufacturing a semiconductor device includes forming first recesses over a semiconductor substrate, forming a first insulation film over the first recesses and the semiconductor substrate, forming second recesses by etching the first insulation film and the semiconductor substrate, forming a second insulation film over the second recesses and the first insulation film, forming gate patterns over the second insulation film at positions perpendicularly overlapping with the second recesses, and forming a second insulation film pattern and a first insulation film pattern at both edges of the lower part of each of the gate patterns by etching the second and first insulation films until the semiconductor substrate is exposed, wherein the thicknesses of the second and first insulation film patterns are asymmetrical to each other.

The first recesses may be formed to have a depth of 100 Å~400 Å.

The first insulation film may include an oxide film and may be formed to have a thickness of 10 Å~100 Å.

The second recesses may be formed to have a depth of 1200 Å~1500 Å.

The second insulation film may include an oxide film and may be formed to have a thickness of 1 Å~100 Å.

The width of the first recesses may be greater than the width of the second recesses.

The semiconductor substrate, connected to a storage node contact plug between the gate patterns, may have a step difference higher than the semiconductor substrate connected to a bit line contact plug.

The forming of the gate patterns may include sequentially forming a polysilicon film, a metal silicide and an oxide film over the second insulation film, and etching the polysilicon film, the metal silicide and the oxide film using a gate pattern as a mask until the second insulation film is exposed.

The method may further include, after the forming of the gate patterns, forming third and fourth insulation films over the gate patterns, and etching the third and fourth insulation films until the semiconductor substrate is exposed.

In accordance with another aspect of the present invention, a semiconductor device includes gate patterns formed over a semiconductor substrate provided with recesses, and insulation film patterns formed at both edges of the lower part of each of the gate patterns, wherein the thicknesses of the insulation film patterns formed at both edges of the lower part of each of the gate patterns are asymmetrical to each other.

The thickness of the insulation film pattern, which is formed over the semiconductor substrate and connected to a storage node contact plug between the gate patterns, may be greater than the thickness of the insulation film pattern, which is formed over the semiconductor substrate and connected to a bit line contact plug.

The semiconductor substrate connected to the storage node contact plug between the gate patterns may have a step difference higher than the semiconductor substrate connected to the bit line contact plug.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the appended drawings.

Figure 1:
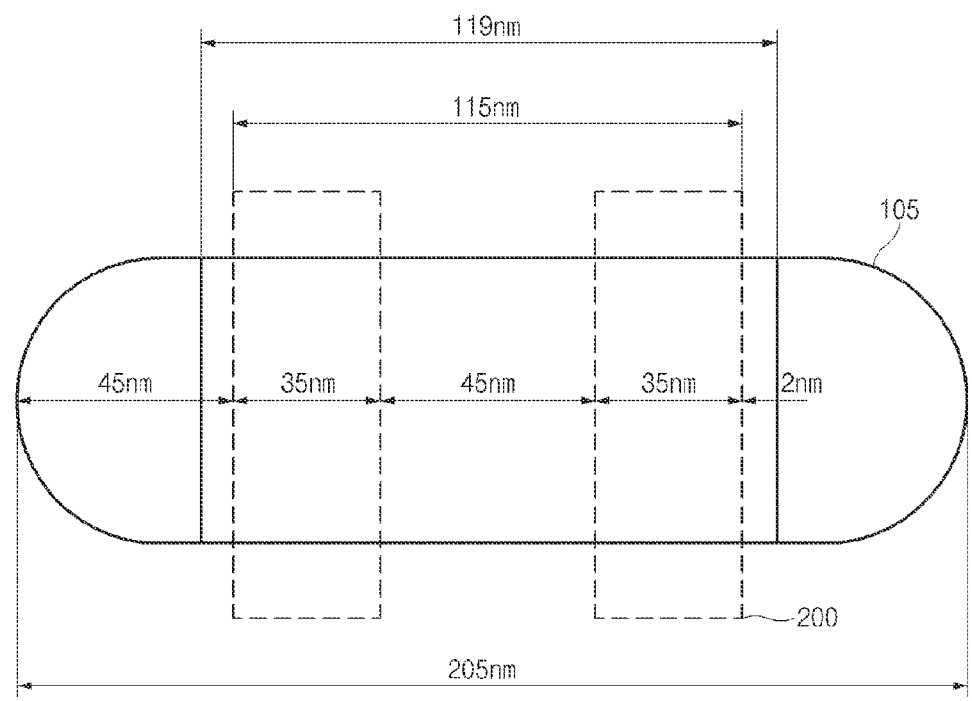
FIG. 1 is a plan view illustrating a semiconductor device according to an embodiment of the present invention.

FIG. 1 is a plan view illustrating a semiconductor device and a method for manufacturing the same according to an embodiment of present invention.

Referring to FIG. 1, an active region 105 and recess gate patterns 200 are formed over a semiconductor substrate.

In accordance with one embodiment, as shown in FIG. 1, the active region 105 is formed to have a width of 205 nm in the horizontal direction and the recess gate patterns 200 are formed to have a width of 35 nm in the horizontal direction. Here, first recesses are formed to have a width of 119 nm, and a width indicating the sum of the widths of the recess gate patterns 200 and the width between the recess gate patterns 200 is 115 nm. The width of first recesses is 4 nm larger than the sum of the widths of the recess gate patterns 200 and the width of the space between the recess gate patterns 200. Due to such a width difference, a gate insulation film between the recess gate pattern 200 and a source/drain region may be thickly deposited during a subsequent gate insulation film deposition process.

Figure 2A:
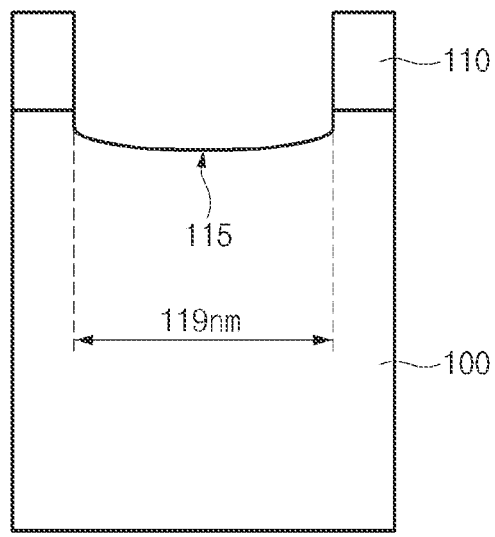
FIGS. 2A to 2N are cross-sectional views illustrating a semiconductor device and a method for manufacturing the same according to an embodiment of the present invention.
Figure 2B:
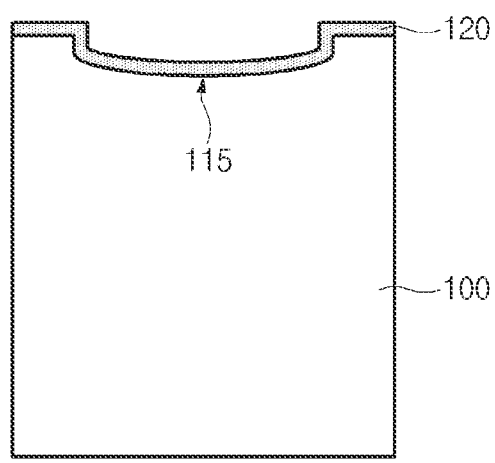
Figure 2C:
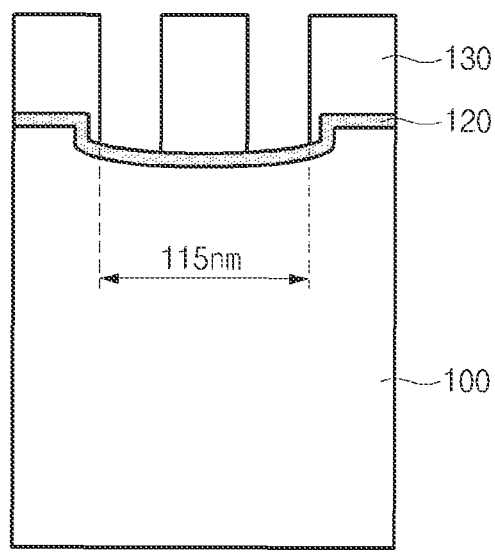
Figure 2D:
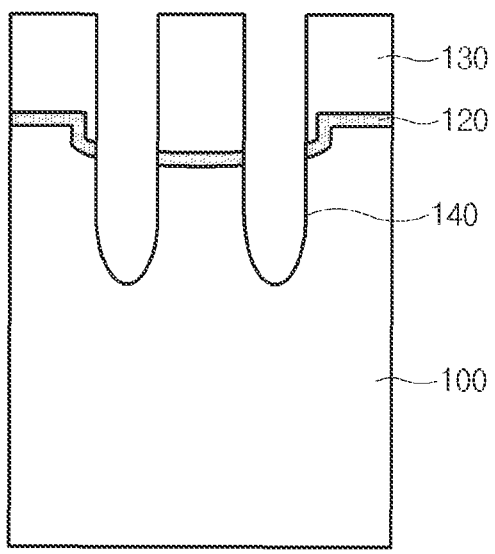
Figure 2E:
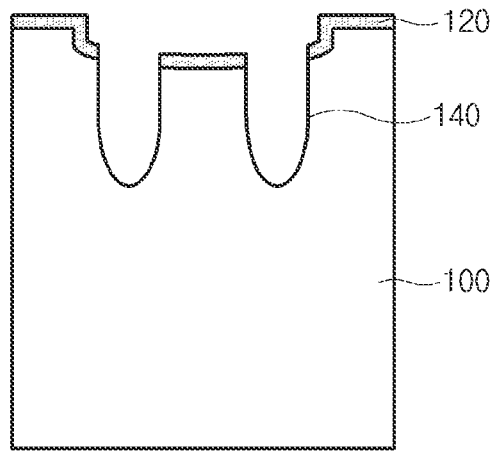
Figure 2F:
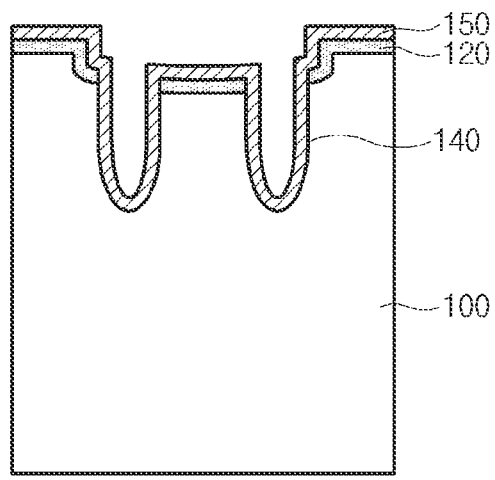
Figure 2G:
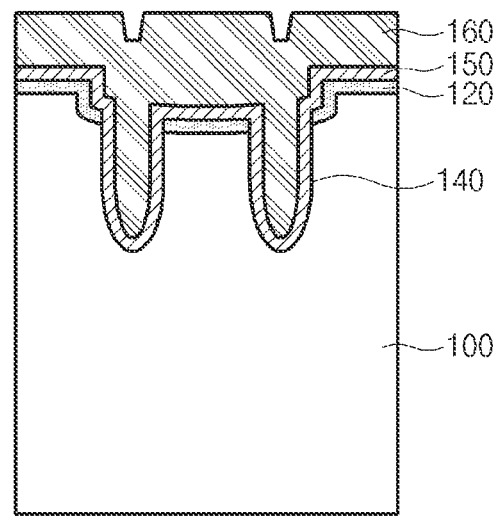
Figure 2H:
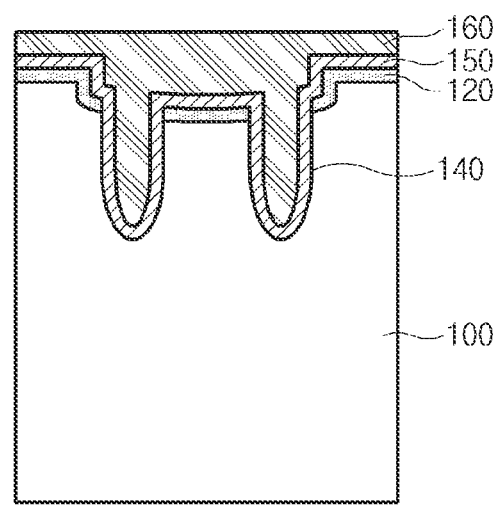
Figure 2I:
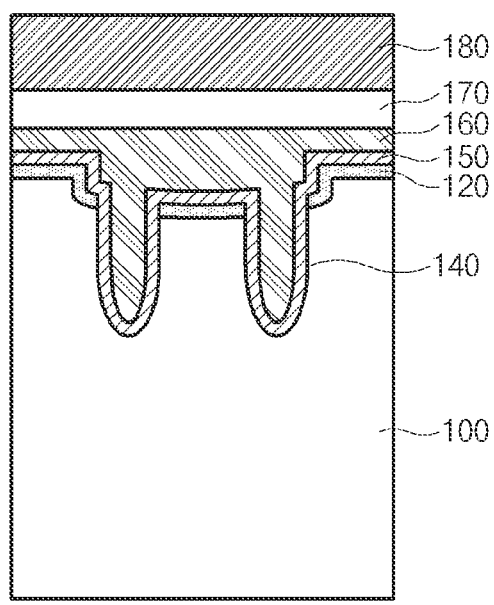
Figure 2J:
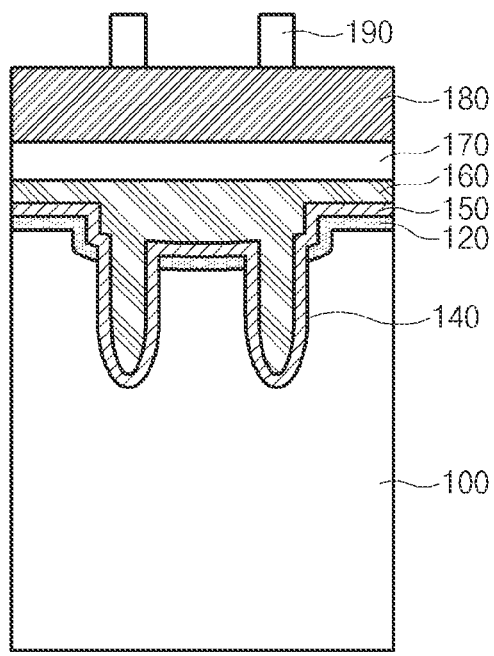
Figure 2K:
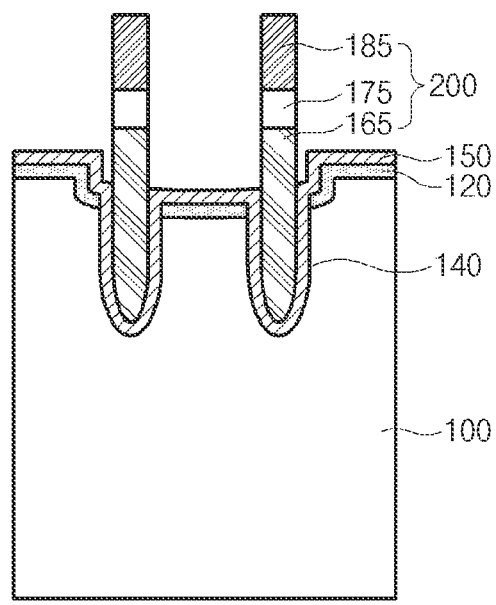
Figure 2L:
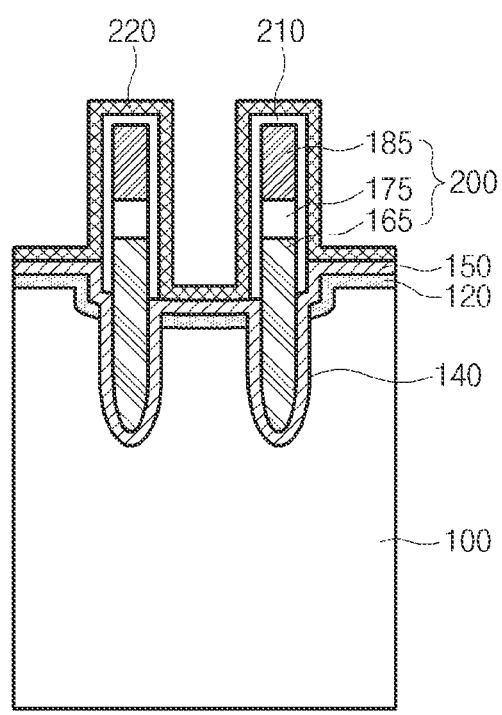
Figure 2M:
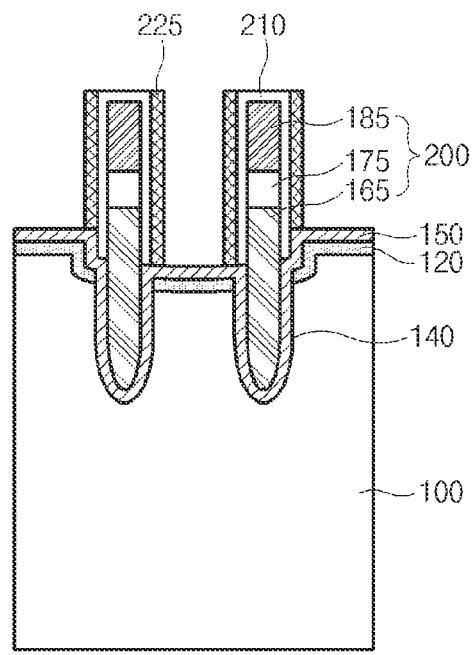
Figure 2N:
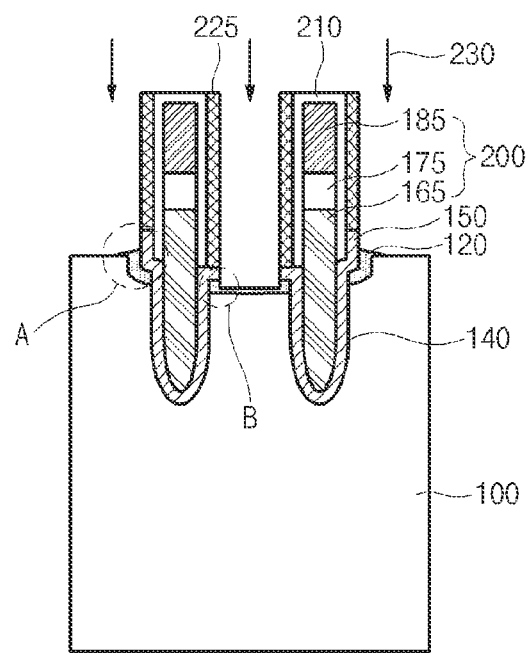

FIGS. 2A to 2N are cross-sectional views illustrating a semiconductor device and the method for manufacturing the same according to the present invention.

Referring to FIG. 2A, after a photoresist film is formed over the semiconductor substrate 100, a photoresist pattern 110 is formed through an exposure and development process using a first recess mask. The semiconductor substrate 100 is etched using the photoresist pattern 110 as an etching mask, thereby forming the first recesses 115. In an embodiment, the first recesses 115, formed by etching the semiconductor substrate 100, preferably have a depth of 100 Å~400 Å, and most preferably have a depth of 200 Å~300 Å.

Referring to FIG. 2B, after the photoresist pattern 110 is removed, a first insulation film 120 is formed over the first recesses 115 and the semiconductor substrate 100. In an embodiment, the first insulation film 120 preferably includes an oxide film and has a thickness of 10 Å~100 Å. The first insulation film 120 most preferably has a thickness of 20 Å~40 Å. Further, dry oxidation is preferably used to form the first insulation film 120.

Referring to FIGS. 2C and 2D, after a photoresist film is formed over the first insulation film 120, a photoresist pattern 130 is formed through an exposure and development process using a recess gate mask. The first insulation film 120 and the semiconductor substrate 100 are etched using the photoresist pattern 130 as an etching mask, thereby forming second recesses 140. In an embodiment, the second recesses 140, formed by etching the first insulation film 120 and the semiconductor substrate 100, preferably have a depth of 1200 Å~1500 Å, and most preferably have a depth of 1300 Å~1400 Å.

Referring to FIGS. 2E and 2F, after the photoresist pattern 130 is removed, a second insulation film 150 is formed over the second recesses 140 and the first insulation film 120. In an embodiment, the second insulation film 150 preferably includes an oxide film and has a thickness of 10 Å~100 Å. The second insulation film 150 most preferably has a thickness of 50 Å~60 Å. Further, dry oxidation is preferably used to form the second insulation film 150. The total thickness of the first and second insulation films 120 and 150 is greater than the thickness of the second insulation film 150 formed over the second recesses 140, thus preventing current leakage between gates, which will be formed in subsequent processes.

Referring to FIGS. 2G and 2H, a polysilicon film 160 is formed over the second insulation film 150. In an embodiment, after the polysilicon film 160 is formed, planarization and etching is performed, preferably using a chemical mechanical polishing (CMP) method.

Referring to FIGS. 2I and 2J, a metal silicide 170 and an oxide film 180 are sequentially formed over the polysilicon film 160. After a photoresist film is formed over the oxide film 180, a photoresist pattern 190 is formed through an exposure and development process using a mask for gate pattern formation.

Referring to FIG. 2K, the oxide film 180, the metal silicide 170, and the polysilicon film 160 are sequentially etched using the photoresist pattern 190 as an etching mask until the second insulation film 150 is exposed, thereby forming gate patterns 200, each of which consists of an oxide film pattern 185, a metal silicide pattern 175 and a polysilicon film pattern 165. In an embodiment, the gate patterns 200 are preferably formed over the insulation film 150.

Referring to FIG. 2L, a third insulation film 210 is formed over the gate patterns 200 and the second insulation film 150. Preferably, the third insulation film 210 includes an oxide film and performs a buffering function between the gate patterns 200 and other insulation films that will be formed during subsequent processes. In an embodiment, the third insulation film 210 preferably has a thickness of 10 Å~50 Å, and most preferably has a thickness of 10 Å~20 Å. Thereafter, an etch back process is performed on the third insulation film 210, etching the third insulation film 210 so that it is formed in a liner pattern along the sidewalls and upper surfaces of the gate patterns 200.

Thereafter, a fourth insulation film 220 is formed over the third insulation film 210 and the second insulation film 150. In an embodiment, the fourth insulation film 220 may include an oxide film or a nitride film. Preferably, the fourth insulation film 220 serves to protect the sidewalls of the gate patterns 200 during a subsequent source/drain formation process. In an embodiment, the fourth insulation film 220 preferably has a thickness of 10 Å~100 Å, and most preferably has a thickness of 60 Å~70 Å.

Referring to FIGS. 2M and 2N, anisotropic etching of the fourth insulation film 220 is carried out until the third insulation film 210 on the upper surfaces of the gate patterns 200 is exposed, thereby forming a fourth insulation film pattern 225 only over the sidewalls of the gate patterns 200 on which the third insulation film 210 is deposited. Thereafter, an etch back process is performed on the second and first insulation films 150 and 120, thereby exposing the semiconductor substrate 100 and forming insulation film patterns A and B over the sidewalls of the gate patterns 200. Impurities are injected into the exposed semiconductor substrate 100 through ion implantation 230, thus forming source/drain regions (not shown). Here, the thicknesses of the insulation film patterns A and B are asymmetrical to each other. The thickness of the insulation film pattern A is formed to be greater than the thickness of the insulation film pattern B through a pattern formation process to reduce gate induced drain leakage (GIDL) and to improve refresh characteristics due to leakage current. There is a step difference between the semiconductor substrate 100 provided with the insulation film pattern B and the semiconductor substrate 100 provided with the insulation film pattern A such that the semiconductor substrate 100 provided with the insulation film pattern B has a height that is lower than the semiconductor substrate 100 provided with the insulation film pattern A. As a result, a semiconductor device according to an embodiment of the present invention has a shorter channel length, thus reducing gate resistance.

As is apparent from the above description, in a semiconductor device and a method for manufacturing the same according to the present invention, a gate insulation film is more thickly deposited in a region (A) that has relatively higher potential of GIDL, thereby reducing GIDL and improving refresh characteristics due to leakage current.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
    forming a first recess over a semiconductor substrate;
    forming a first insulation film over the first recess and the semiconductor substrate;
    forming a plurality of second recesses under the first recess by etching the first insulation film and the semiconductor substrate;
    forming a second insulation film over the second recesses and the first insulation film;
    forming gate patterns over the second insulation film, wherein the gate patterns each fill in the second recesses and extend upwards while having a substantially uniform width; and
    forming a second insulation film pattern and a first insulation film pattern located at the surface of the substrate at a first edge and at a second edge of each of the gate patterns by etching the second and the first insulation films until the semiconductor substrate is exposed, wherein a sum of a thickness of the second and a thickness of the first insulation film patterns is different from each other at the first edge and at the second edge.

2. The method according to claim 1, wherein the first recess is formed to have a depth of 100 Å~400 Å.

3. The method according to claim 1, wherein the first insulation film includes an oxide film and is formed to have a thickness of 10 Å~100 Å.

4. The method according to claim 1, wherein the second recesses are formed to have a depth of 1200 Å~1500 Å.

5. The method according to claim 1, wherein the second insulation film includes an oxide film and is formed to have a thickness of 10 Å~100 Å.

6. The method according to claim 1, wherein a width of the first recess is greater than the width of the second recesses.

7. The method according to claim 1, wherein the semiconductor substrate coupled to a storage node contact plug is formed to be at a higher level than the semiconductor substrate coupled to a bit line contact plug.

8. The method according to claim 1, wherein the forming of the gate patterns includes:
    sequentially forming a polysilicon film, a metal silicide, and an oxide film over the second insulation film; and
    etching the polysilicon film, the metal silicide, and the oxide film using a gate pattern mask until the second insulation film is exposed.

9. The method according to claim 1, after the forming of the gate patterns, the method further comprising:
    forming third and fourth insulation films over the gate patterns; and
    etching the third and fourth insulation films until the semiconductor substrate is exposed.

* * * * *